United States Patent
Kil et al.

(10) Patent No.: US 7,446,053 B2
(45) Date of Patent: Nov. 4, 2008

(54) CAPACITOR WITH NANO-COMPOSITE DIELECTRIC LAYER AND METHOD FOR FABRICATING THE SAME

(75) Inventors: Deok-Sin Kil, Kyoungki-do (KR); Kwon Hong, Kyoungki-do (KR); Seung-Jin Yeom, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/326,064

(22) Filed: Dec. 30, 2005

(65) Prior Publication Data

US 2007/0001201 A1  Jan. 4, 2007

(30) Foreign Application Priority Data

Jun. 30, 2005  (KR) .................. 10-2005-0058757

(51) Int. Cl.
*H01L 21/28* (2006.01)
*H01L 21/44* (2006.01)

(52) U.S. Cl. ............... 438/758; 438/761; 257/E51.001; 977/700; 977/902

(58) Field of Classification Search ............... 438/758; 257/1–798
See application file for complete search history.

(56) References Cited

U.S. PATENT DOCUMENTS

| | | | |
|---|---|---|---|
| 5,583,068 A | 12/1996 | Jones, Jr. et al. | |
| 6,660,660 B2 | 12/2003 | Haukka et al. | |
| 6,797,525 B2 | 9/2004 | Green et al. | |
| 6,825,092 B2 | 11/2004 | Zurcher et al. | |
| 2002/0190294 A1 | 12/2002 | Iizuka et al. | |
| 2002/0197793 A1 | 12/2002 | Dornfest et al. | |
| 2004/0082126 A1 | 4/2004 | Park et al. | |
| 2004/0135492 A1* | 7/2004 | Deguchi ................. 313/496 |
| 2004/0141223 A1* | 7/2004 | Kurashina et al. ........ 359/253 |
| 2004/0191983 A1 | 9/2004 | Basceri et al. | |
| 2005/0070063 A1 | 3/2005 | Im et al. | |

FOREIGN PATENT DOCUMENTS

| EP | 1437618 | 1/2007 |
|---|---|---|
| KR | 2001-0082118 | 8/2001 |
| KR | 10-0531629 | 11/2005 |
| TW | 388098 | 4/2000 |

* cited by examiner

*Primary Examiner*—Walter Lindsay, Jr.
*Assistant Examiner*—Abdulfattah Mustapha
(74) *Attorney, Agent, or Firm*—Blakely, Sokoloff, Taylor & Zafman (57) ABSTRACT

A capacitor with a nano-composite dielectric layer and a method for fabricating the same are provided. A dielectric layer of a capacitor includes a nano-composite layer formed by mixing X number of different sub-layers, X being a positive integer greater than approximately 1. A method for forming a dielectric layer of a capacitor includes: forming a nano-composite layer by mixing X number of different sub-layers in the form of a nano-composition, X being a positive integer greater than approximately 1; and densifying the nano-composite layer.

19 Claims, 3 Drawing Sheets

CAPACITOR WITH NANO-COMPOSITE DIELECTRIC LAYER AND METHOD FOR FABRICATING THE SAME

FIELD OF THE INVENTION

The present invention relates to a semiconductor device and a method for fabricating the same; and, more particularly, to a capacitor with a nano-composite dielectric layer and a method for fabricating the same.

DESCRIPTION OF RELATED ARTS

As the integration scale of memory products has been accelerated by micronization in semiconductor technology, sizes of unit cells have been rapidly scaled down and a low operation voltage can be achieved. However, even though the cell sizes have been decreased, a certain level of capacitance is often required to prevent a soft error event and shorten a refresh time. Therefore, even though a three-dimensional storage node having a semispherical electrode surface with the large surface area has been implemented, the height of an NO capacitor for use in a dynamic random access memory (DRAM) using a silicon nitride ($Si_3N_4$) layer has been continuously increased. The silicon nitride layer is generally formed using dicholorosilane (DCS).

Since it is limited to secure the NO capacitor with a sufficient level of capacitance required for a DRAM with above 256M, high-k dielectric materials or three-dimensional storage nodes (e.g., cylinder or concave type storage nodes) have been used to overcome the capacitance limitation. Examples of high-k dielectric materials are tantalum oxide ($Ta_2O_5$), aluminum oxide ($Al_2O_3$) and hafnium oxide ($HfO_2$).

However, $Ta_2O_5$ has a poor leakage current characteristic. Although $Al_2O_3$ whose dielectric constant is 9 has a good leakage current characteristic, it is still limited to secure a desired level of capacitance due to a low dielectric constant value. $HfO_2$ is capable of securing the capacitance because of a high dielectric constant of $HfO_2$; however, $HfO_2$ has a low intensity of breakdown voltage. Thus, $HfO_2$ is prone to an electric shock, thereby decreasing durability of the capacitor.

Hence, a stack structure including $HfO_2$ and $Al_2O_3$, i.e., a dual dielectric structure, has been proposed.

Figure 1:
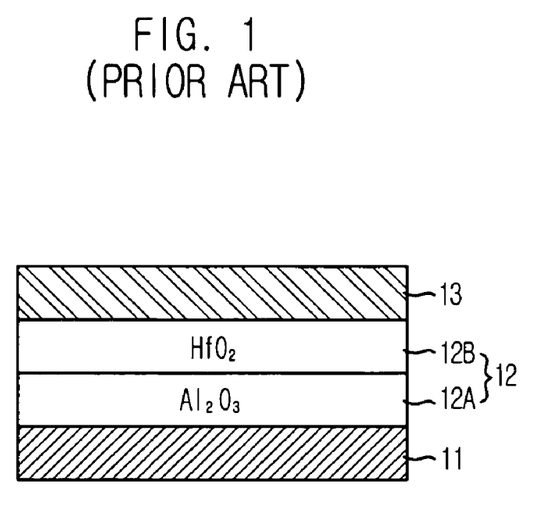
FIG. 1 is a diagram illustrating a capacitor with a conventional dielectric structure including a hafnium oxide ($HfO_2$) layer and an aluminum oxide ($Al_2O_3$) layer.

FIG. 1 is a cross-sectional view showing a capacitor with a conventional dielectric structure of $HfO_2/Al_2O_3$.

A dielectric structure 12 is formed between a lower electrode 11 and an upper electrode 13 and has a dual dielectric structure obtained by stacking an $Al_2O_3$ layer 12A and an $HfO_2$ layer 12B.

Since $Al_2O_3$ has a low dielectric constant, $Al_2O_3$ is produced in the form of a nano-composition in sub-80 nm devices to decrease leakage current. Since $Al_2O_3$ can secure an intended level of leakage current even when $Al_2O_3$ is formed thinly, a good electric characteristic and mass production can be achieved in up to 80 nm devices. However, it is often difficult to apply $Al_2O_3$ to a concave type capacitor in a DRAM since the concave type capacitor requires an equivalent oxide thickness that is scaled down to a greater extent.

Hence, a dielectric layer including a composition of $HfO_2$ and $Al_2O_3$ mixed in a predetermined ratio, more specifically, the dielectric layer including a nano-composition of $HfO_2$ and $Al_2O_3$ has been currently used in a concave type capacitor. Hereinafter, this dielectric layer will be referred to as "HfAlO nano-composite dielectric layer."

However, the HfAlO nano-composite dielectric layer has a low dielectric constant ($\epsilon$) of 9 and a low level of band gap energy of 5 eV, and thus, it is often difficult to obtain an equivalent oxide thickness (EOT) of less than 10 Å, which is a usually required thickness for highly integrated devices designed for sub-70 nm technology. If the physical thickness of the HfAlO nano-composite dielectric layer is reduced to decrease the EOT, a direct tunneling event occurs before reaching the intended EOT of less than approximately 10 Å, and as a result, leakage current may increase abruptly. Accordingly, it may be difficult to employ the HfAlO nano-composite dielectric layer as a dielectric layer of a capacitor.

SUMMARY OF THE INVENTION

It is, therefore, an object of the present invention to provide a capacitor with a nano-composite dielectric layer with an effective oxide thickness of less than approximately 10 Å and an excellent leakage current characteristic, and a method for fabricating the same.

In accordance with an aspect of the present invention, there is provided a dielectric layer of a capacitor. The dielectric layer includes a nano-composite layer formed by mixing X number of different sub-layers, where X is a positive integer greater than approximately 1.

In accordance with another aspect of the present invention, there is provided a method for forming a dielectric layer of a capacitor, including: forming a nano-composite layer by mixing X number of different sub-layers in the form of a nano-composition, X being a positive integer greater than approximately 1; and densifying the nano-composite layer.

In accordance with still another aspect of the present invention, there is provided a capacitor, including: a lower electrode; a nano-composite layer formed by mixing X number of different sub-layers, X being a positive integer greater than approximately 1; and an upper electrode.

In accordance with further aspect of the present invention, there is provided a method for fabricating a capacitor, including: forming a lower electrode; forming a nano-composite layer over the lower electrode, the nano-composite layer including X number of different sub-layers, where X is a positive integer greater than approximately 1; densifying the nano-composite layer; and forming an upper electrode layer over the nano-composite layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A capacitor with a nano-composite dielectric layer and a method for fabricating the same in accordance with exemplary embodiments of the present invention will be described in detail with reference to the accompanying drawings.

According to an exemplary embodiment of the present invention, a $[ZrO_2]_x[TiO_2]_{(1-x)}$ dielectric layer, which is used as a dielectric layer of a capacitor, is introduced. The $[ZrO_2]_x[TiO_2]_{(1-x)}$ dielectric layer is obtained by mixing a zirconium oxide ($ZrO_2$) layer with a titanium oxide ($TiO_2$) layer in a predetermined ratio. $ZrO_2$ has high band gap energy (Eg), and $TiO_2$ has a high dielectric constant ($\epsilon$). Herein, the $[ZrO_2]_x[TiO_2]_{(1-x)}$ layer is a nano-composite dielectric layer.

Table 1 below shows dielectric constants, band gap energy values and conduction band offset (CBO) values depending on dielectric material types.

TABLE 1

| Dielectric Material | Dielectric Constant | Band Gap Energy (Eg, eV) | CBO to Si (eV) |
| --- | --- | --- | --- |
| $SiO_2$ | 3.9 | 8.9 | 3.5 |
| $Si_3N_4$ | 7 | 5.1 | 2.4 |
| $Al_2O_3$ | 9 | 8.7 | 2.8 |
| $Y_2O_3$ | 15 | 5.6 | 2.3 |
| $ZrO_2$ | 25 | 7.8 | 1.4 |
| $HfO_2$ | 25 | 5.7 | 1.5 |
| $Ta_2O_5$ | 26 | 4.5 | 0.3 |
| $La_2O_3$ | 30 | 4.3 | 2.3 |
| $TiO_2$ | 80 | 3.5 | 0.0 |

As shown in Table 1, since $SiO_2$, $Si_3N_4$, $Al_2O_3$, and $Y_2O_3$ have the dielectric constant of less than approximately 20, these dielectric materials have a difficulty in securing a required level of capacitance for a capacitor of a highly integrated semiconductor device. Dielectric materials such as $ZrO_2$, $HfO_2$, $Ta_2O_5$, $La_2O_3$, and $TiO_2$ have the dielectric constant of greater than approximately 20, these dielectric materials make it possible to secure the required level of capacitance. However, since $Al_2O_3$ and $HfO_2$ have limitations in securing a sufficient capacitance level and an intended level of durability of a capacitor, respectively, these dielectric materials are limitedly used as a dielectric layer of a capacitor.

Therefore, according to the exemplary embodiment of the present invention, the $ZrO_2$ layer is mixed with the $TiO_2$ layer in a predetermined ratio to form a nano-composite structure. As mentioned above, $ZrO_2$ has high band gap energy (Eg) of approximately 7.8 eV, and $TiO_2$ has a high dielectric constant of approximately 80. As a result of the mixing, an amorphous $[ZrO_2]_x[TiO_2]_{(1-x)}$ dielectric layer used as a dielectric layer of a capacitor can be formed. Herein, the band gap energy of $ZrO_2$ is greater than the band gap energy of $HfO_2$ by at least approximately 0.5 eV, and the dielectric constant of $TiO_2$ is greater than the dielectric constants of $Al_2O_3$ and $HfO_2$ by at least approximately 71. Hereinafter, the $[ZrO_2]_x[TiO_2]_{(1-x)}$ dielectric layer obtained according to the exemplary embodiment of the present invention will be referred to as "nano-composite dielectric layer."

Hereinafter, a unit cycle of an atomic layer deposition (ALD) method for depositing the nano-composite dielectric layer will be described in detail.

The unit cycle of the ALD method is defined as following:

[(Zr source/purge/oxygen providing source/purge)$_m$(Ti source/purge/oxygen providing source/purge)$_n$]$_Q$.

Herein, the Zr source is a pulse that supplies a Zr source material for producing $ZrO_2$, and the Ti source is a pulse that supplies a Ti source material for producing $TiO_2$. The subscripts 'm', 'n' and 'Q', each being a positive integer greater than approximately 1, represent the number of (Zr source/purge/oxygen providing source/purge) cycles, the number of (Ti source/purge/oxygen providing source/purge) cycles and the number of the unit cycles determining the total thickness of the nano-composite dielectric layer, respectively.

In more detail of the unit cycle, the (Zr source/purge/oxygen providing source/purge) cycle is referred to as a $ZrO_2$ deposition cycle, including: supplying the Zr source material; purging out the non-reacted Zr source material; supplying an oxygen providing source material; and purging out the Zr source material and the oxygen providing source material that are not reacted. The $ZrO_2$ deposition cycle is repeated m times, where m is a natural number. The (Ti source/purge/oxygen providing source/purge) cycle is referred to as a $TiO_2$ deposition cycle, including: supplying the Ti source material; purging out the non-reacted Ti source material; supplying the oxygen providing source material; and purging out the Ti source material and the oxygen providing source material that are not reacted. The $TiO_2$ deposition cycle is repeated n times, wherein n is a natural number. By repeating the $ZrO_2$ deposition cycle and the $TiO_2$ deposition cycle m and n times, respectively, a $ZrO_2$ layer and a $TiO_2$ layer are deposited with intended thicknesses. A combined deposition cycle including the $ZrO_2$ deposition cycle and the $TiO_2$ deposition cycle (i.e., the unit cycle) is repeated Q times to determine the entire thickness of the nano-composite dielectric layer.

The number of the $ZrO_2$ deposition cycle expressed as 'm' and that of the $TiO_2$ deposition cycle expressed as 'n' are controlled such that the thicknesses of the $ZrO_2$ layer and the $TiO_2$ layer are less than approximately 10 Å (i.e., in a range from approximately 0.1 Å to approximately 9.9 Å) in order for the $ZrO_2$ layer and the $TiO_2$ layer to be mixed consistently. If the thicknesses of the $ZrO_2$ layer and the $TiO_2$ layer are greater than approximately 10 Å, the $ZrO_2$ layer and the $TiO_2$ layer are formed in a stack structure in which the $ZrO_2$ layer and the $TiO_2$ layer are stacked over each other. Thus, in the case of applying the $ZrO_2$ layer and the $TiO_2$ layer, which are deposited separately, to a capacitor, the $ZrO_2$ layer and the $TiO_2$ layer make a direct contact with the upper electrode and the lower electrode. As a result, crystallization by a fine mixing cannot be achieved, and a leakage current characteristic is degraded at regions where the $TiO_2$ layer, which has low band gap energy, is in contact with the upper electrode and the lower electrode.

As mentioned previously, the nano-composite dielectric layer has an amorphous characteristic obtained based on a specific mixing characteristic (i.e., nano-composition) of the $ZrO_2$ layer and the $TiO_2$ layer, and an intended level of an electric characteristic can be secured by controlling a ratio of the $ZrO_2$ layer in the nano-composition of the $ZrO_2$ layer and the $TiO_2$ layer. Specifically, the ratio of the $ZrO_2$ layer in this nano-composition can be controlled by adjusting a ratio of m to n.

The number of the $ZrO_2$ deposition cycle (i.e., 'm') and the number of the $TiO_2$ deposition cycle (i.e., 'n') are controlled to obtain the consistent mixing of the $ZrO_2$ layer and the $TiO_2$ layer and the amorphous characteristic. That is, a ratio of m to n is controlled to be in a range of approximately 0.1 to approximately 0.8. For instance, if n is approximately 100, m ranges from approximately 10 to approximately 80. Also, the ratio of m to n is controlled such that the $ZrO_2$ layer and the $TiO_2$ layer are deposited to a thickness of less than approximately 10 Å. If the thicknesses of the $ZrO_2$ layer and the $TiO_2$ layer are approximately 0.5 Å per cycle, m and n will be approximately 20.

Figure 2:
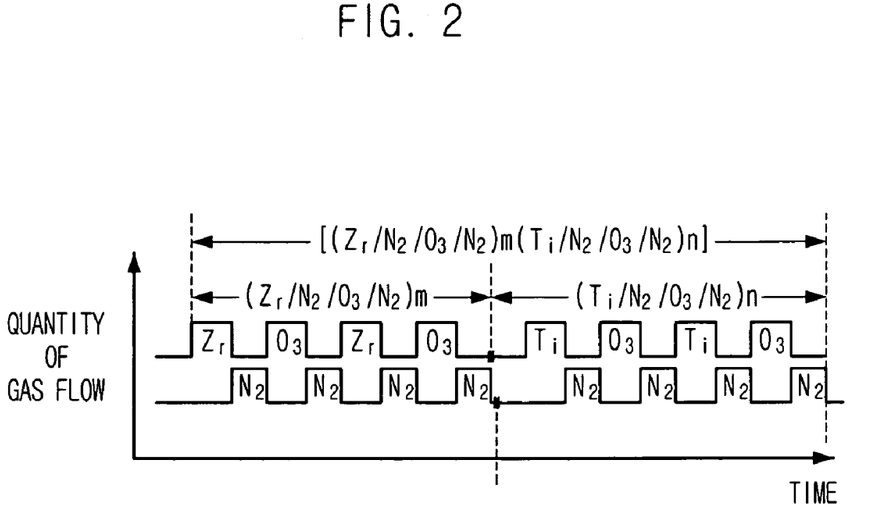
FIG. 2 is a graph for illustrating an atomic layer deposition (ALD) method of depositing a nano-composite dielectric layer (e.g., a $[ZrO_2]_x[TiO_2]_{(1-x)}$ layer) in accordance with a first embodiment of the present invention.

FIG. 2 is a graph illustrating an ALD method for depositing a nano-composite dielectric layer in accordance with a first embodiment of the present invention. Particularly, the graph illustrates sequential supply of specific gases related to the ALD method for forming the nano-composite dielectric layer into a reaction chamber in due course. The nano-composite dielectric layer according to the first embodiment of the present invention is an amorphous $[ZrO_2]_x[TiO_2]_{1-x}$ dielectric layer obtained by mixing a $ZrO_2$ layer advantageous of band gap energy with a $TiO_2$ layer advantageous of dielectric constant in the form of a nano-composition.

As illustrated, a cycle of $(Zr/N_2/O_3/N_2)$ is a $ZrO_2$ deposition cycle and is repeated m times. Herein, Zr, $N_2$ and $O_3$ are a Zr source material, a purge gas and an oxygen providing source material, respectively. A cycle of $(Ti/N_2/O_3/N_2)$ is a $TiO_2$ deposition cycle and is repeated n times. Herein, Ti, $N_2$ and $O_3$ are a Ti source material, a purge gas and an oxygen providing source material, respectively.

The $ZrO_2$ deposition cycle and the $TiO_2$ deposition cycle are carried out at a chamber maintained with a pressure of approximately 0.1 torr to approximately 10 torr and a substrate temperature of approximately 100° C. to approximately 350° C.

In more detail of the $ZrO_2$ deposition cycle, the Zr source material is supplied to the chamber maintained with the aforementioned condition for approximately 0.1 seconds to approximately 3 seconds for adsorption of the Zr source material onto the substrate. The Zr source material is selected from the group consisting of $Zr(O-tBu)_4$, $Zr[N(CH_3)_2]_4$, $Zr[N(C_2H_5)(CH_3)]_4$, $Zr[N(C_2H_5)_2]_4$, $Zr(TMHD)_4$, $Zr(OiC_3H_7)(TMHD)$, and $Zr(OtBu)_4$.

The $N_2$ gas is then supplied to the chamber for approximately 0.1 seconds to approximately 5 seconds to purge out the non-adsorbed Zr source material. The $O_3$ gas, which is the oxygen providing source material, is supplied to the chamber for approximately 0.1 seconds to approximately 3 seconds to induce a reaction between the adsorbed Zr source material and the $O_3$ gas. From this reaction, a $ZrO_2$ layer is deposited. The $N_2$ gas is supplied again to the chamber for approximately 0.1 seconds to approximately 5 seconds to purge out the non-reacted $O_3$ gas and by-products from the reaction.

By repeating the $ZrO_2$ deposition cycle m times, the $ZrO_2$ layer is deposited to a thickness less than approximately 10 Å (e.g., in a range from approximately 0.1 Å to approximately 9.9 Å). In addition to the $O_3$ gas, the oxygen providing source material which oxidizes the Zr source material, the oxygen providing source material can include $H_2O$ or $O_2$ plasma. Also, an inert gas such as Ar gas can also be used as the purge gas. As another purge method, a vacuum pump can be used to purge out the by-products or remaining gases.

In more detail of the $TiO_2$ deposition cycle, the Ti source material is supplied to the chamber maintained with the aforementioned condition (i.e., the substrate temperature of approximately 100° C. to approximately 350° C. and the pressure of approximately 0.1 torr to approximately 10 torr) for approximately 0.1 seconds to approximately 3 seconds for adsorption of the Ti source material onto the substrate. The Ti source material can be one selected from an alkoxide based material and a β-diketonate based ligand containing material. The alkoxide based material is selected from the group consisting of $Ti(i-OC_2H_7)_4$, $Ti(n-OC_4H_9)_4$, $Ti(t-OC_4H_9)_4$, $Ti(OC_2H_5)_4$, $Ti(OCH_3)_4$, and $Ti(n-OC_2H_7)_4$. The β-diketonate based ligand containing material is selected from the group consisting of $Ti(THD)_3$, $Ti(OiPr)_2(THD)_2$ and $Ti(MPD)(THD)_2$. The $N_2$ gas is supplied to the chamber for approximately 0.1 seconds to approximately 5 seconds to purge out the non-adsorbed Ti source material. The $O_3$ gas is then supplied to the chamber for approximately 0.1 seconds to approximately 3 seconds to induce a reaction between the Ti source material and the $O_3$ gas. As a result of this reaction, the $TiO_2$ layer, which is an atomic layer, is deposited. The $N_2$ gas is supplied again to the chamber for approximately 0.1 seconds to approximately 5 seconds to purge out the non-reacted $O_3$ gas and the by-products from the reaction.

By repeating the $TiO_2$ deposition cycle n times, the $TiO_2$ layer is deposited to a thickness less than approximately 10 Å (e.g., in a range from approximately 0.1 Å to approximately 9.9 Å). In addition to the $O_3$ gas, the oxygen providing source material which oxidizes the Ti source material, the oxygen providing source material can include $H_2O$ or $O_2$ plasma. Also, an inert gas such as Ar gas can also be used as the purge gas. As another purge method, a vacuum pump can be used to purge out the by-products or remaining gases.

The reason for maintaining the substrate temperature low is to minimize a chemical vapor deposition (CVD) reaction caused by a thermal decomposition of the Zr source and the Ti source. As described above, the ALD method can prevent a generation of particles more effectively than a CVD method and is performed at low temperature to obtain better device characteristics than those by the CVD method performed at high temperature.

Figure 3:
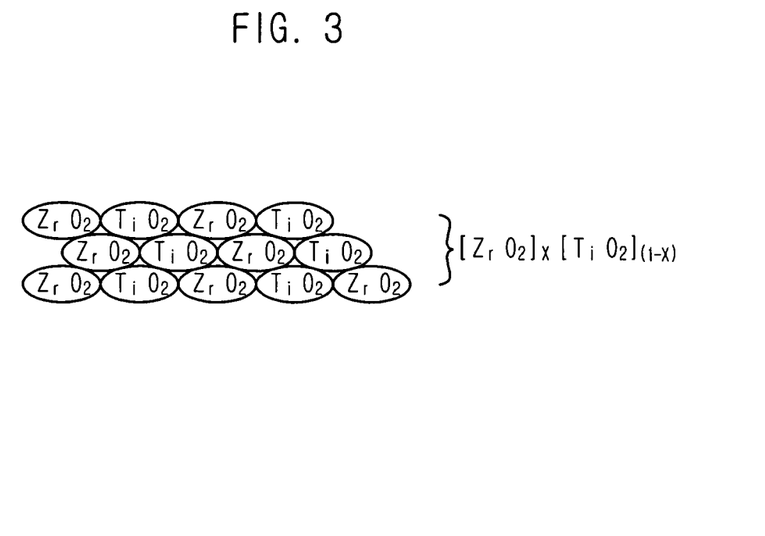
FIG. 3 is a diagram illustrating a structure of the $[ZrO2]_x[TiO2]_{(1-x)}$ layer illustrated in FIG. 2.

FIG. 3 is a diagram illustrating a structure of a nano-composite dielectric layer deposited by the ALD method described in FIG. 2.

As illustrated, instead of a stack structure in which the $ZrO_2$ layer and the $TiO_2$ layer are stacked layer by layer, the nano-composite dielectric layer has a nano-composite dielectric structure obtained by mixing the $ZrO_2$ layer with the $TiO_2$ layer in a predetermined ratio. The ALD method deposits each of the $ZrO_2$ layer and the $TiO_2$ layer to a thickness of less than approximately 10 Å for every unit cycle through controlling the number of the $ZrO_2$ deposition cycle and the number of the $TiO_2$ deposition cycle (i.e., 'm' and 'n'), and thus, the nano-composite dielectric structure including the $ZrO_2$ layer and the $TiO_2$ layer can be obtained. The thickness of less than approximately 10 Å means that the $ZrO_2$ layer and the $TiO_2$ layer are deposited inconsecutively. In other words, if the $ZrO_2$ layer and the $TiO_2$ layer are deposited to a thickness greater than approximately 10 Å, the $ZrO_2$ layer and the $TiO_2$ layer are deposited consecutively, thereby resulting in a stack structure.

There are several conditions to obtain the nano-composite dielectric layer. First, the thicknesses of the $ZrO_2$ layer deposited by the above described $ZrO_2$ deposition cycle and the $TiO_2$ layer deposited by the above described $TiO_2$ deposition cycle should be less than approximately 10 Å (i.e., in a range of approximately 0.1 Å to approximately 9.9 Å). As mentioned above, if the thickness is greater than approximately 10 Å, each of the $ZrO_2$ layer and the $TiO_2$ layer is deposited consecutively with individual characteristics and thus, device characteristics may be degraded.

Second, the number of the $ZrO_2$ deposition cycle (i.e., 'm') and the number of $TiO_2$ deposition cycle (i.e., 'n') should be set in a certain range of ratio to obtain a nano-composite structure. That is, the ratio of 'm' to 'n' ranges between approximately 0.1 to approximately 0.8. For instance, if 'n' is approximately 100, 'm' ranges from approximately 10 to approximately 80. Also, the ratio of 'm' to 'n' is controlled such that the $ZrO_2$ layer and the $TiO_2$ layer are deposited to a thickness of less than approximately 10 Å. If the thicknesses of the $ZrO_2$ layer and the $TiO_2$ layer are approximately 0.5 Å per deposition cycle, 'm' and 'n' will be approximately 20.

By controlling the ratio of 'm' to 'n', the $ZrO_2$ layer and the $TiO_2$ layer are mixed in the form of a nano-composition, resulting in the nano-composite dielectric layer of $[ZrO_2]_x[TiO_2]_{1-x}$, which is not the $ZrO_2$ layer and not the $TiO_2$ layer.

The nano-composite dielectric layer obtained by the ALD method performed under the above described conditions has several characteristics; they are, increased crystallization temperature and heat-resistant and improved dielectric characteristics.

Figure 4:
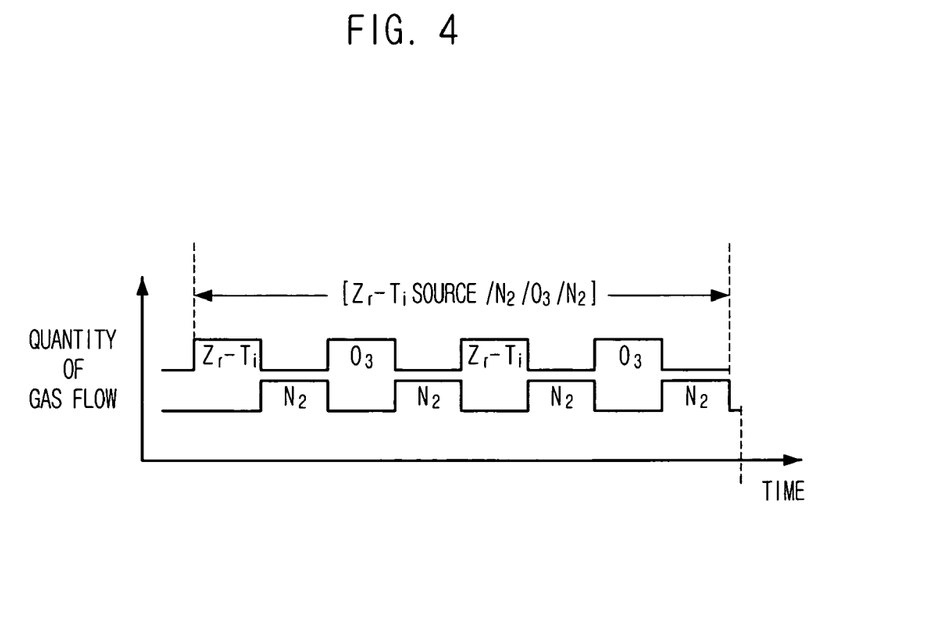
FIG. 4 is a graph for illustrating an ALD method for depositing a nano-composite dielectric layer (e.g., a $[ZrO_2]_x[TiO_2]_{(1-x)}$ layer) in accordance with a second embodiment of the present invention.

FIG. 4 is a graph illustrating an ALD method for depositing a nano-composite dielectric layer in accordance with a second embodiment of the present invention. Particularly, the graph illustrates sequential supply of specific gases related to the ALD method for forming the nano-composite dielectric layer into a reaction chamber in due course. The nano-composite dielectric layer according to the second embodiment of the present invention is an amorphous $[ZrO_2]_x[TiO_2]_{1-x}$ dielectric layer obtained by mixing a $ZrO_2$ layer advantageous of band gap energy with a $TiO_2$ layer advantageous of dielectric constant in the form of a nano-composition.

A unit cycle for depositing the $[ZrO_2]_x[TiO_2]_{1-x}$ dielectric layer is defined as following:

[(Zr—Ti source/purge/oxygen providing source/purge)Q.

Herein, the Zr—Ti source is a single molecular source material, and 'Q' which is a positive integer greater than approximately 1 is the number of performing the unit cycle.

The above unit cycle includes sequential supply of the Zr—Ti source material, a purge gas, an oxygen providing source material, and a purge gas and is repeated 'Q' times to deposit a nano-composite dielectric layer (i.e., the $[ZrO_2]_x[TiO_2]_{1-x}$ dielectric layer). According to the second embodiment of the present invention, the $[ZrO_2]_x[TiO_2]_{1-x}$ dielectric layer is deposited for every unit cycle. Hence, being different from the first embodiment, there is no thickness limitation in depositing the $[ZrO_2]_x[TiO_2]_{1-x}$ dielectric layer.

Hereinafter, the deposition of the $[ZrO_2]_x[TiO_2]_{1-x}$ dielectric layer according to the second embodiment will be described in detail with reference to FIG. 4.

For approximately 0.1 seconds to approximately 3 seconds, a Zr—Ti source material that Zr and Ti atoms are compounded in one molecule is supplied into a chamber maintained with a substrate temperature of approximately 100° C. to approximately 350° C. and a pressure of approximately 0.1 torr to approximately 10 torr. Herein, 'MMP' and 'OiPr' represent methoxymethyl-2-propoxide and isopropoxide, respectively.

The purge gas, for instance, $N_2$ gas is supplied for approximately 0.1 seconds to approximately 5 seconds to remove non-reacted $ZrTi(MMP)_2(OiPr)_5$ molecules, and the oxygen providing source material, for instance, $O_3$ gas is supplied for approximately 0.1 seconds to approximately 3 seconds to induce a reaction between the adsorbed $ZrTi(MMP)_2(OiPr)_5$ molecules and the $O_3$ gas molecules. As a result, a $[ZrO_2]_x[TiO_2]_{1-x}$ layer is deposited in an atomic level. The $N_2$ gas is supplied again for approximately 0.1 seconds to approximately 5 seconds to purge out the non-reacted $O_3$ gas molecules and by-products of the reaction.

This unit cycle is repeated 'Q' times, and as a result, the $[ZrO_2]_x[TiO_2]_{1-x}$ layer is deposited to a thickness of approximately 25 Å to approximately 200 Å.

In addition to the $O_3$ gas, the oxygen providing source material can include $H_2O$ or $O_2$ plasma. Also, in addition to the $N_2$ gas, an inert gas such as Ar gas can be supplied as the purge gas. As another purge method, a vacuum pump can be used to purge out any remaining gases or the reaction by-products.

The substrate temperature is maintained low to minimize a CVD reaction by a thermal decomposition of the Zr—Ti source material. As described above, the ALD method can prevent a generation of particles more effectively than a CVD method and is performed at low temperature to obtain better device characteristics than those by the CVD method performed at high temperature.

A structure of the $[ZrO_2]_x[TiO_2]_{1-x}$ layer deposited according to the second embodiment illustrated in FIG. 4 is substantially identical to the structure thereof illustrated in FIG. 3. Therefore, instead of a stack structure, the $[ZrO_2]_x[TiO_2]_{1-x}$ layer according to the second embodiment has a nano-composite structure resulted as the $ZrO_2$ layer and the $TiO_2$ layer are deposited to a thickness of less than approximately 10 Å for each unit cycle.

According to the first and second embodiments, the nano-composite layer (i.e., the $[ZrO_2]_x[TiO_2]_{1-x}$ layer) has a high dielectric constant ranging from approximately 20 to approximately 80 and a certain level of band gap energy ranging from approximately 3.5 eV to approximately 7.8 eV. The dielectric constant and the band gap energy can be adjusted by controlling a ratio of m to n (refer to FIG. 2) or the number of Q (refer to FIG. 4). Also, in both the first embodiment and the second embodiment, the nano-composite dielectric layer can be densified after the formation of the nano-composite dielectric layer. An annealing process is one example of the densification and is performed at approximately 300° C. to approximately 500° C. for approximately 30 seconds to approximately 120 seconds.

As a reference, considering that a thin HfAlO layer has a dielectric constant of approximately 14 to obtain an equivalent oxide thickness (EOT) of approximately 12.5 Å, the $[ZrO_2]_x[TiO_2]_{1-x}$ layer has lower band gap energy than the HfAlO layer. Despite of this low band gap energy which might be a cause of leakage current, it is possible to overcome the leakage current event by increasing the thickness of the $[ZrO_2]_x[TiO_2]_{1-x}$ layer using the high dielectric constant thereof. As a result, the EOT of less than approximately 10 Å can be achieved. Accordingly, compared with the stack structure of $ZrO_2/TiO_2$, the nano-composite structure of $[ZrO_2]_x[TiO_2]_{1-x}$ can more effectively obtain the EOT of less than approximately 10 Å.

Figure 5:
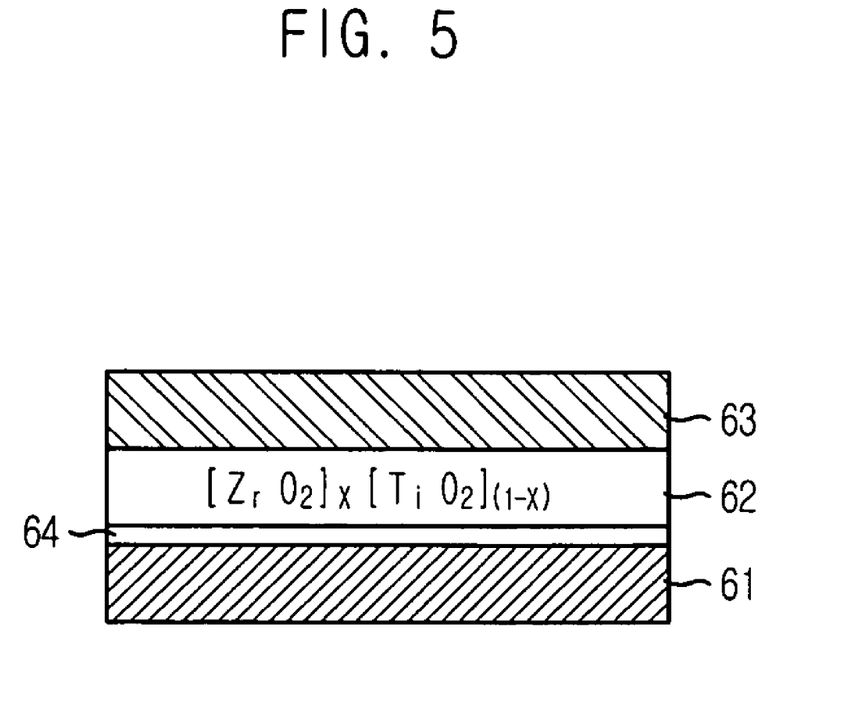
FIG. 5 is a diagram illustrating a structure of a capacitor with a nano-composite dielectric layer (e.g., a $[ZrO_2]_x[TiO_2]_{(1-x)}$ layer) in accordance with a third embodiment of the present invention.

FIG. 5 is a diagram illustrating a capacitor with a $[ZrO_2]_x[TiO_2]_{1-x}$ dielectric layer in accordance with an embodiment of the present invention. Herein, the $[ZrO_2]_x[TiO_2]_{1-x}$ dielectric layer has a nano-composite dielectric structure. Substantially identical to the above described embodiments, the $[ZrO_2]_x[TiO_2]_{1-x}$ dielectric layer will be referred to as "nano-composite dielectric layer" hereinafter.

As illustrated, the capacitor includes: a lower electrode 61; the nano-composite dielectric layer 62 formed on the lower electrode 61; and an upper electrode 63 formed on the nano-composite dielectric layer 62. The lower electrode 61 and the upper electrode 63 are formed of a material selected from a group consisting of polysilicon doped with phosphorus (P) or arsenic (As), titanium nitride (TiN), ruthenium (Ru), ruthenium oxide ($RuO_2$), platinum (Pt), iridium (Ir), and iridium oxide ($IrO_2$). For instance, the capacitor can be formed in a silicon-insulator-silicon (SIS) structure, wherein the lower electrode 61 and the upper electrode 63 are formed of polysilicon. Also, a metal-insulator-silicon (MIS) capacitor structure or a metal-insulator-metal (MIM) capacitor structure can also be possible. For the MIS capacitor structure, the lower electrode 61 is formed of polysilicon and the upper electrode 63 is formed of metal or metal oxide. For the MIM capacitor structure, the lower electrode 61 and the upper electrode 63 are formed of metal or metal oxide. The lower electrode 61 can be formed in a stack structure or in a three-dimensional structure such as a concave structure or a cylinder structure.

As illustrated in FIGS. 2 and 4, the nano-composite dielectric layer 62 disposed between the lower electrode 61 and the upper electrode 63 is formed through an ALD method. For instance, a $ZrO_2$ deposition cycle and a $TiO_2$ deposition cycle are repeatedly performed to form the nano-composite dielectric layer 62 having the total thickness of approximately 25 Å to approximately 200 Å. Alternatively, the nano-composite dielectric layer can be formed by repeating the unit cycle described in the second embodiment (refer to FIG. 4).

The $ZrO_2$ layer and the $TiO_2$ layer do not contact the lower electrode 61 and the upper electrode 63 separately, but contact the lower electrode 61 and the upper electrode 63 simultaneously. That is, the nano-composite dielectric layer 62 is not formed in a stack structure that the $HfO_2$ layer and the $ZrO_2$ layer are sequentially stacked over each other; instead, the $ZrO_2$ layer and the $TiO_2$ layer are mixed in the form of a nano-composition.

As described above, according to the ALD method, the number of the unit cycle can be controlled to deposit the $ZrO_2$ layer and the $TiO_2$ layer inconsecutively, so that the nano-composite dielectric layer 62 can have a nano-composite structure. Since the nano-composite dielectric layer 62 is deposited as same as the first embodiment and the second embodiment of the present invention, detailed description thereof will be omitted.

The repetition number of the unit cycle (e.g., the $ZrO_2$ deposition cycle expressed as 'm' and the $TiO_2$ deposition cycle expressed as 'n') is controlled to deposit the $[ZrO_2]_x[TiO_2]_{1-x}$ layer with the total thickness of approximately 25 Å to approximately 200 Å. For instance, as described in FIG. 2, a ratio of 'm' to 'n' is set in a range between approximately 0.1 and approximately 0.8.

As described above, the $ZrO_2$ layer and the $TiO_2$ layer are formed to have a thickness less than approximately 10 Å for the purpose of depositing the $ZrO_2$ layer and the $TiO_2$ layer inconsecutively. If the thickness of each of the $ZrO_2$ layer and the $TiO_2$ layer is greater than approximately 10 Å, the $ZrO_2$ layer and the $TiO_2$ layer are deposited consecutively, resulting in a stack structure of the $ZrO_2$ layer and the $TiO_2$ layer that do not contact the lower electrode 61 and the upper electrode 63 simultaneously. The stack structure has a degraded device characteristic compared with the nano-composite structure of $[ZrO_2]_x[TiO_2]_{1-x}$.

Although not illustrated, the nano-composite dielectric layer can be densified after the formation of the nano-composite dielectric layer. An annealing process is one example of the densification and is performed at approximately 300° C. to approximately 500° C. for approximately 30 seconds to approximately 120 seconds.

If the lower electrode 61 includes polysilicon, a rapid thermal process (RTP) is performed at approximately 800° C. to approximately 1,000° C. for approximately 10 seconds to approximately 120 seconds in an atmosphere of ammonia ($NH_3$) to prevent formation of a native oxide layer as the lower electrode 61 is oxidized during the formation of the nano-composite dielectric layer 62 on the lower electrode 61. As a result of the RTP, a silicon nitride layer 64 is formed, and this silicon nitride layer prevents deterioration of a leakage current characteristic and a decrease in the dielectric constant. Since the leakage current characteristic can be secured using even the thin nano-composite dielectric layer as the dielectric layer of the capacitor, a high level of capacitance can also be obtained.

Particularly, according to the exemplary embodiments of the present invention, the nano-composite dielectric layer includes a nano-mixture of the $ZrO_2$ layer advantageous of band gap energy and the $TiO_2$ layer advantageous of dielectric constant, and using the nano-composite dielectric layer as the dielectric layer of the capacitor, a sub-65 nm level capacitor often requiring the EOT of less than approximately 10 Å can be fabricated.

The present application contains subject matter related to the Korean patent application No. KR 2005-0058757, filed in the Korean Patent Office on Jun. 30, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a capacitor, comprising:
forming a lower electrode;
forming a nano-composite layer over the lower electrode by mixing X number of different sub-layers, where X is a positive integer greater than approximately 1;
densifying the nano-composite layer; and
forming an upper electrode layer over the nano-composite layer.

2. The method of claim 1, wherein the forming of the nano-composite layer includes depositing two different sub-layers, one of which includes $ZrO_2$ having a large band gap energy and the other of which includes $TiO_2$ having a large dielectric constant.

3. The method of claim 2, wherein the depositing of the $ZrO_2$ sub-layer and the $TiO_2$ sub-layer are carried out by performing a unit cycle until the nano-composite layer has a predetermined thickness ranging from approximately 25 Å to approximately 200 Å.

4. The method of claim 3, wherein the unit cycle includes a $ZrO_2$ deposition cycle and a $TiO_2$ deposition cycle performed M and N times respectively, M and N being positive integers each being greater than approximately 1, until each of the $ZrO_2$ sub-layer and the $TiO_2$ sub-layer has a predetermined thickness ranging from approximately 0.1 Å to approximately 9.9 Å.

5. The method of claim 4, wherein each of the $ZrO_2$ deposition cycle and the $TiO_2$ deposition cycle includes:
adsorbing a source material;
purging out the source material that is not reacted;
supplying an oxygen providing source material to react with the adsorbed source material; and
purging out the oxygen providing source material that is not reacted and reaction by-products.

6. The method of claim 5, wherein each of the $ZrO_2$ deposition cycle and the $TiO_2$ deposition cycle is performed at a chamber in which a pressure and a temperature of a substrate are maintained at approximately 0.1 torr to approximately 10 torr and at approximately 100° C. to approximately 350° C., respectively.

7. The method of claim 5, wherein in the case of the $ZrO_2$ deposition cycle, the source material is selected from the group consisting of $Zr(O\text{-}tBu)_4$, $Zr[N(CH_3)_2]_4$, $Zr[N(C_2H_5)(CH_3)]_4$, $Zr[N(C_2H_5)_2]_4$, $Zr(TMHD)_4$, $Zr(OiC_3H_7)(TMHD)$, and $Zr(OtBu)_4$.

8. The method of claim 5, wherein in the ease of the $TiO_2$ deposition cycle, the source material is selected from an alkoxide based material or a β-diketonate based ligand containing material.

9. The method of claim 8, wherein the alkoxide based material is selected from the group consisting of $Ti(i\text{-}OC_2H_7)_4$, $Ti(n\text{-}OC_4H_9)_4$, $Ti(t\text{-}OC_4H_9)_4$, $Ti(OC_2H_5)_4$, $Ti(OCH_3)_4$, and $Ti(n\text{-}OC_2H_7)_4$.

10. The method of claim 8, wherein the β-diketonate based ligand containing material is selected from the containing group consisting of Ti(THD)$_3$, Ti(OiPr)$_2$(THD)$_2$ and Ti(MPD)(THD)$_2$.

11. The method of claim 5, wherein the oxygen providing source material is selected from the group consisting of O$_3$, H$_2$O and O$_2$ plasma and the purging includes supplying nitrogen gas or an inert gas.

12. The method of claim 1, wherein the densifying the nano-composite layer is carried out by performing an annealing process at approximately 300° C. to approximately 500° C. for approximately 30 seconds to approximately 120 seconds.

13. The method of claim 3, wherein the unit cycle includes:
adsorbing a source material;
purging out the source material that is not reacted;
supplying an oxygen providing source material to react with the adsorbed source material; and
purging out the oxygen providing source material that is not reacted and reaction by-products.

14. The method of claim 13, wherein the unit cycle is performed at a chamber in which a pressure and a temperature of a substrate are maintained at approximately 0.1 torr to approximately 10 torr and at approximately 100° C. to approximately 350° C., respectively.

15. The method of claim 13, wherein the source material includes ZrTi(MMP)$_2$(OiPr)$_5$.

16. The method of claim 13, wherein the oxygen providing source material is selected from the group consisting of O$_3$, H$_2$O and O$_2$ plasma and the purging includes supplying nitrogen gas or an inert gas.

17. The method of claim 1, wherein in the forming of the lower electrode, the lower electrode includes polysilicon doped with phosphorus or arsenic.

18. The method of claim 1, further comprising forming a silicon nitride layer between the lower electrode and the nano-composite layer.

19. The method of claim 18, wherein the forming of the silicon nitride layer includes performing a rapid thermal process (RTP) at approximately 800° C. to approximately 1,000° C. for approximately 10 seconds to approximately 120 seconds.

* * * * *

UNITED STATES PATENT AND TRADEMARK OFFICE
CERTIFICATE OF CORRECTION

PATENT NO. : 7,446,053 B2  Page 1 of 1
APPLICATION NO. : 11/326064
DATED : November 4, 2008
INVENTOR(S) : Kil et al.

It is certified that error appears in the above-identified patent and that said Letters Patent is hereby corrected as shown below:

Col. 10 in Claim 8, line 60, please delete "ease" and insert -- case --.

Signed and Sealed this

Second Day of June, 2009

JOHN DOLL
*Acting Director of the United States Patent and Trademark Office*